(12) United States Patent
Ching et al.

(10) Patent No.: US 10,134,870 B2
(45) Date of Patent: Nov. 20, 2018

(54) SEMICONDUCTOR STRUCTURE AND METHOD OF MANUFACTURING THE SAME

(71) Applicant: TAIWAN SEMICONDUCTOR MANUFACTURING CO., LTD., Hsinchu (TW)

(72) Inventors: Kuo-Cheng Ching, Hsinchu County (TW); Shi-Ning Ju, Hsinchu (TW); Chih-Hao Wang, Hsinchu County (TW); Ying-Keung Leung, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/409,617

(22) Filed: Jan. 19, 2017

(65) Prior Publication Data
US 2018/0151688 A1    May 31, 2018

Related U.S. Application Data

(60) Provisional application No. 62/426,667, filed on Nov. 28, 2016.

(51) Int. Cl.
| H01L 21/82 | (2006.01) |
| H01L 29/66 | (2006.01) |
| H01L 21/02 | (2006.01) |
| H01L 29/51 | (2006.01) |
| H01L 21/311 | (2006.01) |

(52) U.S. Cl.
CPC ...... *H01L 29/6653* (2013.01); *H01L 21/0214* (2013.01); *H01L 21/02247* (2013.01); *H01L 21/02271* (2013.01); *H01L 21/31116* (2013.01); *H01L 29/513* (2013.01); *H01L 29/518* (2013.01); *H01L 29/6656* (2013.01)

(58) Field of Classification Search
CPC ...................... H01L 29/785; H01L 21/823431
See application file for complete search history.

(56) References Cited

U.S. PATENT DOCUMENTS

| 7,425,740 B2 | 9/2008 | Liu et al. |
| 8,048,723 B2 | 11/2011 | Chang et al. |
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |

(Continued)

*Primary Examiner* — Mark Prenty
(74) *Attorney, Agent, or Firm* — McClure, Qualey & Rodack, LLP (57) ABSTRACT

A semiconductor structure includes a substrate, a fin, a bottom capping structure and a top capping structure. The fin disposed on the substrate, the fin has a lower portion and an upper portion extending upwards from the lower portion. The bottom capping structure covers a sidewall of the lower portion of the fin. The top capping structure covers a sidewall of the upper portion of the fin.

20 Claims, 9 Drawing Sheets

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 9,595,583 B2 * | 3/2017 | Kim ................ H01L 21/823437 |
| 2013/0285153 A1 | 10/2013 | Lee et al. |
| 2014/0183600 A1 | 7/2014 | Huang et al. |
| 2014/0264590 A1 | 9/2014 | Yu et al. |
| 2014/0264592 A1 | 9/2014 | Oxland et al. |
| 2015/0102386 A1 * | 4/2015 | Chen ................ H01L 21/823431 257/192 |
| 2015/0263003 A1 | 9/2015 | Lee et al. |
| 2018/0019316 A1 * | 1/2018 | Cheng ................ H01L 29/6681 |

\* cited by examiner

SEMICONDUCTOR STRUCTURE AND METHOD OF MANUFACTURING THE SAME

This application claims priority to U.S. Provisional Application Ser. No. 62/426,667, filed Nov. 28, 2016, which is herein incorporated by reference.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the feature size has decreased. The semiconductor integrated circuit industry has produced numerous developments in effort to continue the process of scaling. One of the developments is the replacement or supplementation of the conventional planar metal-oxide-semiconductor field-effect transistor by the vertical field-effect transistor. However, existing vertical field-effect transistors have not been satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In conventional FINFET fabrications, liners or capping layers are formed covering the fins in order to protect the fins from oxidation and/or degradation in subsequent processes. Various liners or capping layers, such as silicon nitride (SiN) and/or siliconborocarbonitride (SiBCN) have been used in the manufacturing of the semiconductor devices. However, conventional liners or capping layers suffers some problems such as the so-called "dishing" in shallow trench isolation (STI) structures.

The present disclosure relates generally to a semiconductor structure and the manufacturing method thereof. According to some embodiments of the present disclosure, the semiconductor structure and the method disclosed herein may mitigate or even resolve the issues discussed above. Although embodiments hereinafter are discussed in a particular order, various other embodiments may be performed in any logical order and may include fewer or more steps described herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
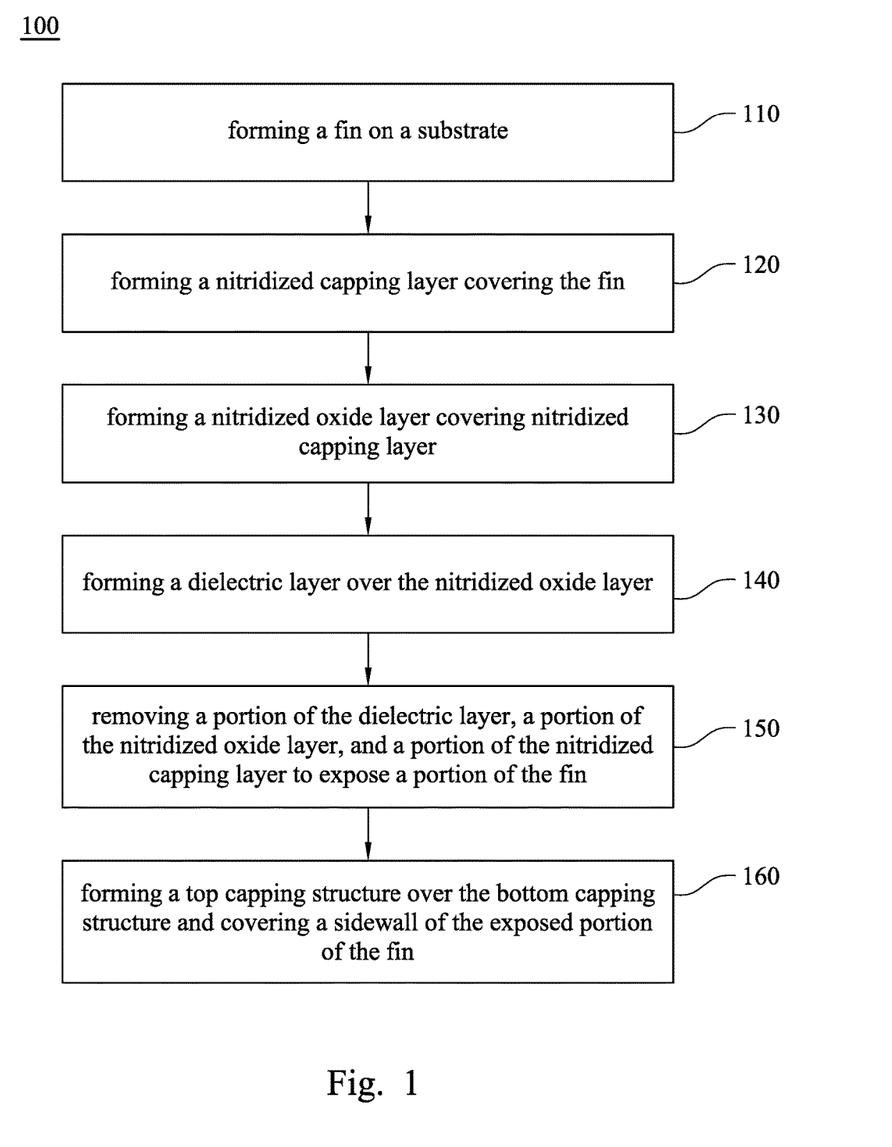
FIG. 1 is a flowchart illustrating a method of fabricating a semiconductor structure according to some embodiments of the present disclosure.

FIG. 1 is a flowchart illustrating a method 100 of manufacturing a semiconductor structure 200 according to some embodiments of the present disclosure. FIGS. 2-9 are cross sectional views illustrating various stages of the method 100 according to some embodiments of the present disclosure. It is understood that additional steps can be provided before, during, and/or after the method 100, and some of the steps described can be replaced, eliminated, and/or moved around for additional embodiments of the method 100.

Figure 2:
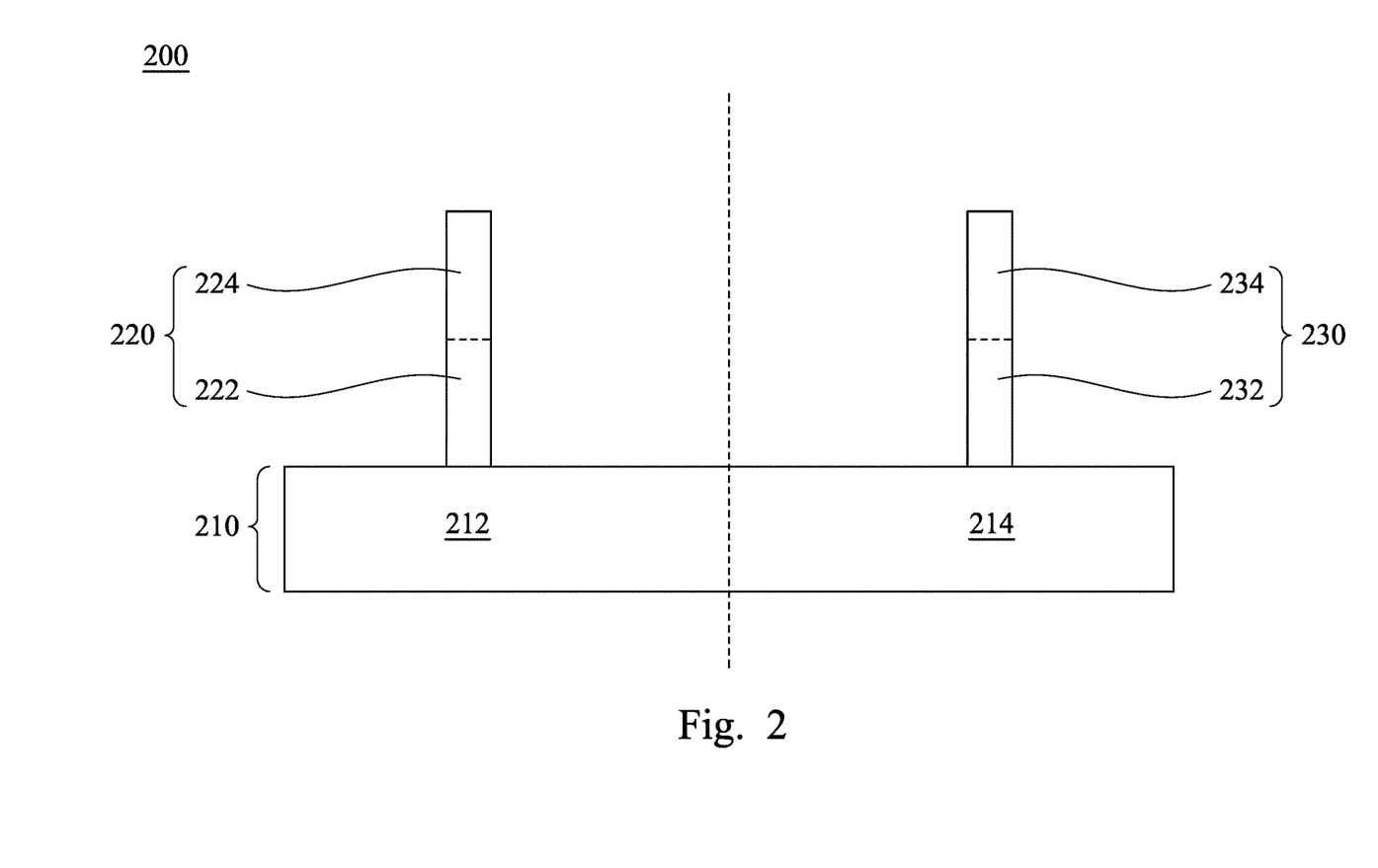
FIGS. 2-9 are cross sectional views illustrating various stages of the method according to some embodiments of the present disclosure.

Referring now to FIGS. 1 and 2, the method 100 begins at operation 110 by forming a fin on a substrate. FIG. 2 illustrates the formation of a fin 220 and a fin 230 on a substrate 210 according to some embodiments. In some embodiments, the substrate 210 has a PMOS region 212 and a NMOS region 214 thereon. The fins 220, 230 are respectively formed on the PMOS region 212 and the NMOS region 214. The fin 220 and fin 230 have respective lower portions 222, 232 and respective upper portions 224, 234. In some embodiments, the fin 220 and fin 230 are similar in structure and material. For example, the lower portions 222, 232 and the upper portions 224, 234 of the fins 220, 230 are made of silicon. In yet some embodiments, each of the fins 220, 230 may include composite material. Specifically, the lower portions 222, 232 of the fins 220, 230 may include silicon or consist essentially of silicon with or without dopants, but the upper portions 224, 234 of the fins 220, 230 may include silicon germanium or consist essentially of silicon germanium with or without dopants. In yet some embodiments, however, the material of the fin 220 formed on the PMOS region 212 may differ from that of the fin 230 formed on the NMOS region 214. Specifically, both the lower and upper portions 232, 234 of the fin 230 may include silicon or consist essentially of silicon, whereas the upper portion 224 of the fin 220 is made of silicon germanium while the lower portion 222 of the fin 220 is made of silicon. In some examples, the upper portion 224 of the fin 220 has a germanium molar concentration ranged from about 10% to about 35%, such as for example 15%, 20%, 25%, and 30%. One skilled in the art readily understands that the fins 220, 230 are shown for the illustrative purpose only, and more fins may be formed on the substrate 210.

In some embodiments, the fins 220, 230 may be fabricated using suitable processes including photolithography and etch processes. The photolithography process may include forming a photoresist layer (resist) overlying the substrate (e.g., on a silicon layer), exposing the resist by a patterned mask, performing post-exposure bake processes, and developing the resist to form a masking layer. An etching process may be carried out using the masking layer to form the fins 220, 230. Illustrative examples of the etching process include wet etching techniques and/or dry etching techniques such as plasma etching techniques, reactive ion etch (RIE) techniques and other suitable techniques.

In some embodiment, the fins 220, 230 may be formed by double-patterning lithography (DPL) process. DPL is a method of constructing a pattern on a substrate by dividing the pattern into two interleaved patterns. DPL allows to enhance feature (e.g., fin) densities. Various DPL methodologies that may be used include double exposure (e.g., using two mask sets), forming spacers adjacent features and removing the features to provide a pattern of spacers, resist freezing, and/or other suitable processes.

One skilled in the art readily understands that the processes described above are just examples of the formation of the fins 220, 230. In other embodiments, a dielectric layer may be formed over a top surface of the substrate 210; trenches may be formed in the dielectric layer; homoepitaxial structures may be epitaxially grown in the trenches; and the dielectric layer may be recessed such that the homoepitaxial structures protrude from the dielectric layer to form the fins 220, 230. In still other embodiments, heteroepitaxial structures may be used for the fins 220, 230. In an even further embodiment, a dielectric layer may be formed over a top surface of the substrate 210; trenches may be formed in the dielectric layer; heteroepitaxial structures may be epitaxially grown in the trenches using a material different from the substrate 210; and the dielectric layer may be recessed such that the heteroepitaxial structures protrude from the dielectric layer to form the fins 220, 230. In some embodiments where homoepitaxial or heteroepitaxial structures are epitaxially grown, the grown materials may be in situ doped during growth, which may obviate prior and subsequent implantations although in situ and implantation doping may be used together.

The substrate 210 may be a semiconductor substrate, such as a semiconductor-on-insulator (SOI) substrate, a bulk semiconductor, or the like. Alternatively, the substrate may be a wafer, such as a silicon wafer. The SOI substrate may include a layer of a semiconductor material formed on an insulator layer. The insulator layer may be, for example, a silicon oxide layer, a buried oxide (BOX) layer, or the like. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, AlInAs, GaAsP, AlGaAs, GaInP, GaInAs and/or GaInAsP; or combinations thereof.

The substrate 210 may include active devices (not shown) or passive devices (not shown) that may be used to generate the desired structural and functional parts of the design. The active devices may include a wide variety of active devices such as transistors, and the like. The passive devices, for example, may be capacitors, resistors, inductors, and the like. The active devices and passive devices may be formed using any suitable methods either within or else on the substrate 210.

Figure 3:
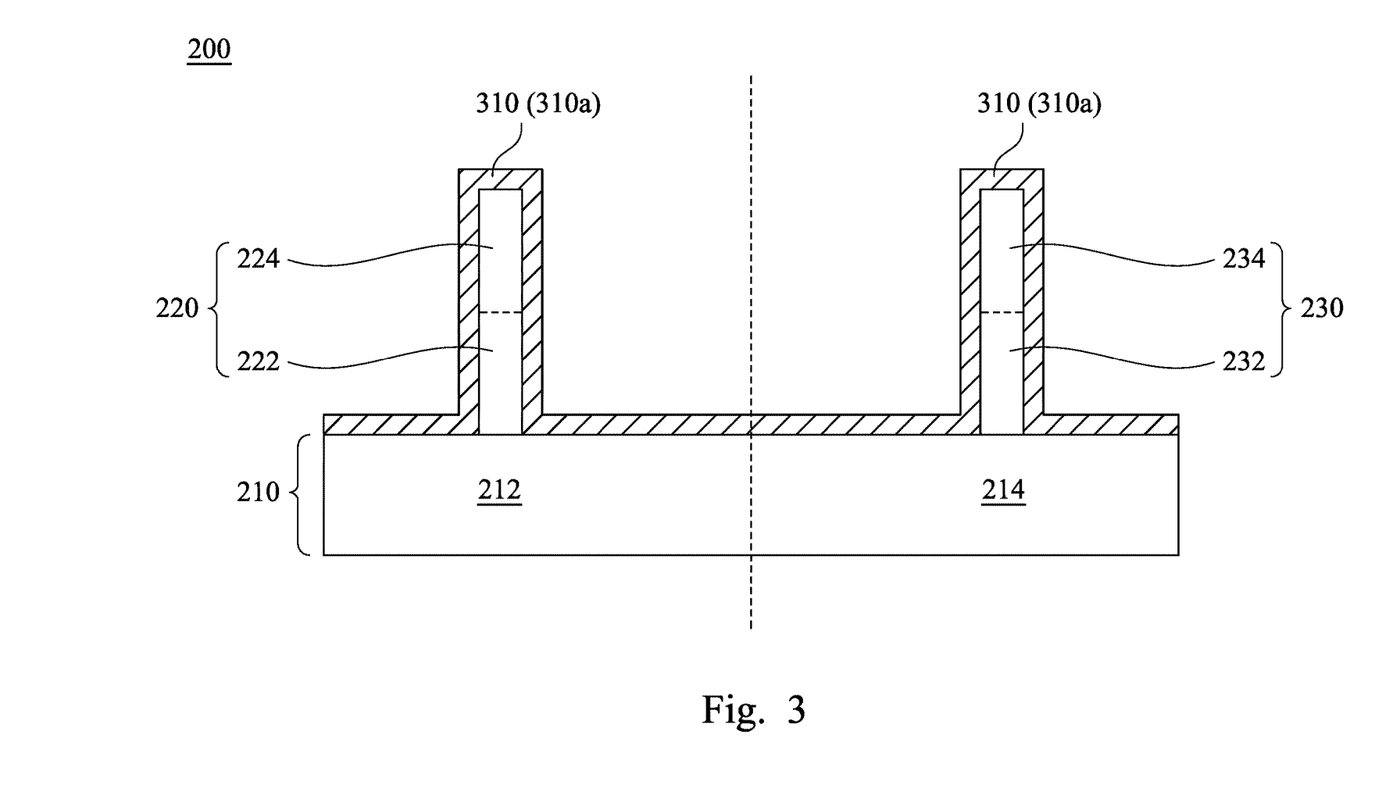

Referring now to FIGS. 1 and 3, the method 100 proceeds to operation 120 by forming a nitridized capping layer covering the fin. FIG. 3 illustrates the deposition of a nitridized capping layer 310a that conformally covers the fins 220, 230 according to some embodiments of the present disclosure. The nitridized capping layer 310a may be formed by various approaches. In some embodiments, a capping material layer 310 is first deposited to cover the substrate 210, the fin 220 and the fin 230. The capping material layer 310 may include or consist essentially of silicon, for example. After forming the capping material layer 310, a nitridation treatment is carried out to transform the capping material layer 310 into the nitridized capping layer 310a, in accordance with some embodiments. The nitridation treatment may be a rapid thermal nitridation (RTN) process and/or other suitable processes such as nitrogen implantation techniques. In some examples, the nitridized capping layer 310a has a nitrogen molar percentage of less than 12 mol %. For instance, the nitrogen molar percentage of the nitridized capping layer 310a may be ranged from about 2 mol % to about 8 mol %, such as 3 mol %, 4 mol %, 5 mol %, 6 mol %, and 7 mol %. The capping material layer 310 may be formed by suitable approaches such as chemical vapor deposition (CVD) processes, sub-atmospheric CVD (SACVD) processes, flowable CVD processes, atomic layer deposition (ALD) processes, physical vapor deposition (PVD) processes, and/or other suitable processes. In yet some embodiments, the capping material layer 310 may be formed by epitaxial growth processes, such as a molecular beam epitaxial (MBE) process, a metalorganic chemical vapor deposition (MOCVD) process, and/or other suitable epitaxial growth processes.

Figure 4:
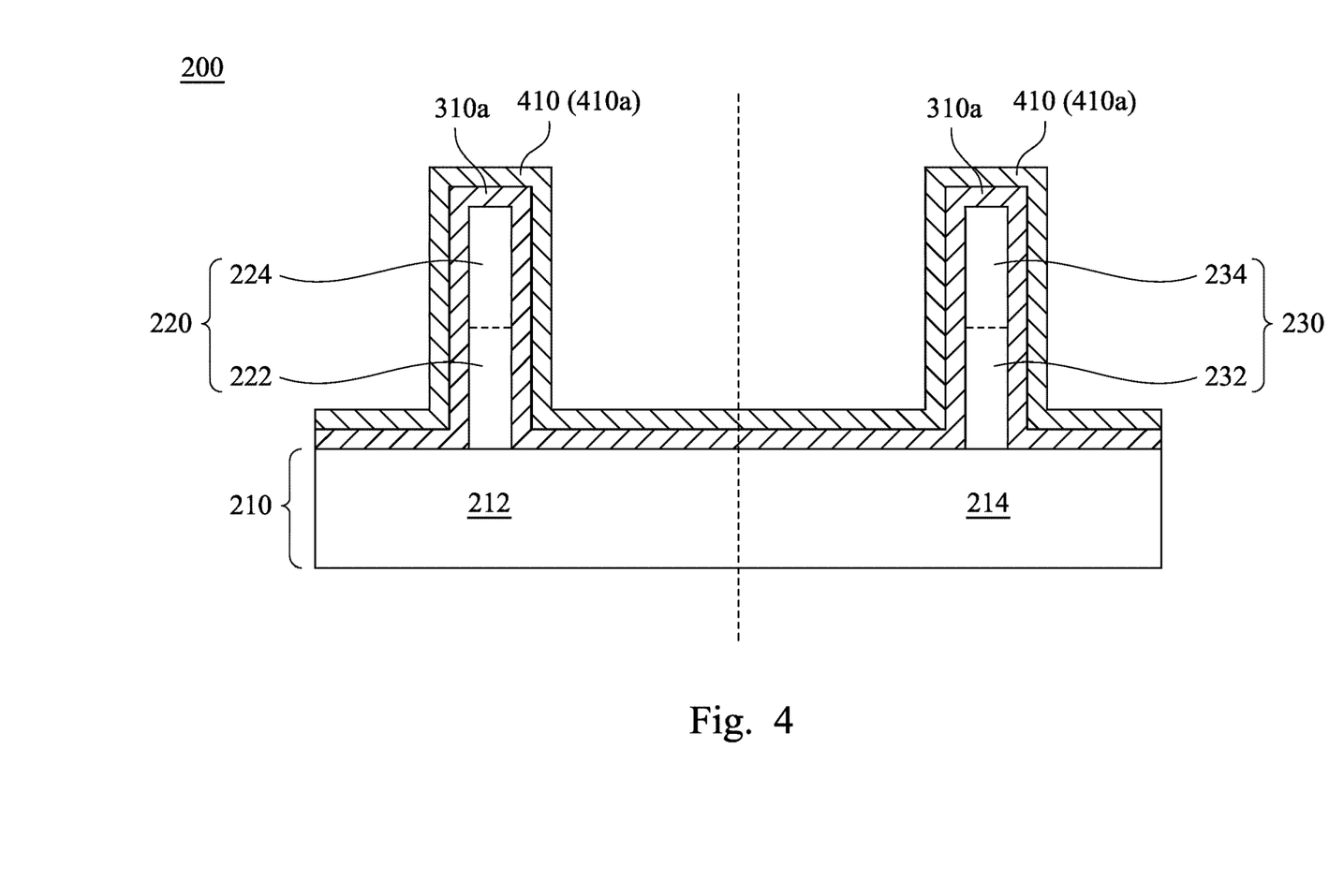

Referring now to FIGS. 1 and 4, the method 100 proceeds to operation 130 by forming a nitridized oxide layer covering nitridized capping layer. FIG. 4 illustrates the formation of a nitridized oxide layer 410a conformally covering the nitridized capping layer 310a. The nitridized oxide layer 410a may be formed by various approaches. In some embodiments, a first oxide layer 410 is first deposited to conformally cover the nitridized capping layer 310a. For example, the first oxide layer 410 may include $SiO_2$ or other suitable oxide materials. Thereafter, the first oxide layer 410 is nitridized to form the nitridized oxide layer 410a. The first oxide layer 410 may be nitridized by various processes such as rapid thermal nitridation (RTN) processes and/or other suitable processes such as nitrogen implantation techniques. In some examples, the nitridized oxide layer 410a has a nitrogen molar percentage of less than 12 mol %. For example, the nitrogen molar percentage of the nitridized oxide layer 410a may be ranged from about 2 mol % to about 8 mol %, such as 3 mol %, 4 mol %, 5 mol %, 6 mol %, and 7 mol %. The first oxide layer 410 may be deposited by suitable approaches such as chemical vapor deposition (CVD) processes, sub-atmospheric CVD (SACVD) processes, flowable CVD processes, atomic layer deposition (ALD) processes, physical vapor deposition (PVD) processes, and/or other suitable process.

Figure 5:
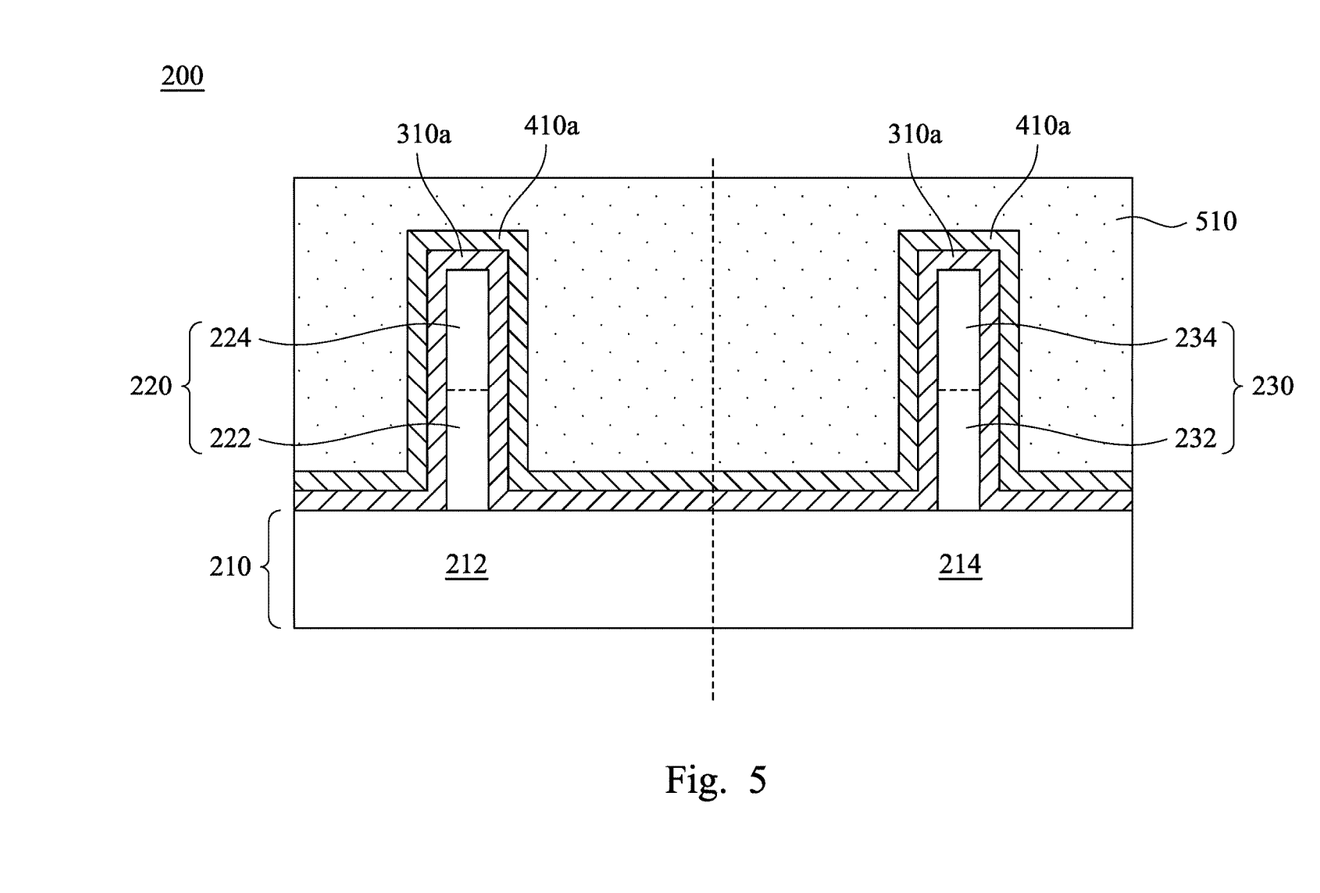

Referring now to FIGS. 1 and 5, the method 100 proceeds to operation 140 by forming a dielectric layer over the nitridized oxide layer. FIG. 5 illustrates the formation of a dielectric layer 510 over the nitridized oxide layer 410a according to some embodiments. The dielectric layer 510 may be formed by a chemical vapor deposition (CVD) process, a sub-atmospheric CVD (SACVD) process, a flowable CVD process, an atomic layer deposition (ALD) process, a physical vapor deposition (PVD) process, and/or other suitable processes. In examples, the dielectric layer 510 includes a layer of silicon oxide formed by a flowable CVD process. Nevertheless, other dielectric materials formed by any acceptable process may be used. In yet some embodiments, a first annealing process may be performed to densify the deposited dielectric layer 510. Thereafter, a planarization process (e.g., a chemical mechanical polishing process) may optionally be carried out to remove an excessing portion of the dielectric layer 510, thereby exposing the top surfaces of the fins 220, 230. In some embodiments, a second annealing process may be performed to improve the quality of the dielectric layer 510 after the planarization process. Illustrative examples of the first and second annealing processes include rapid thermal anneal (RTA) processes, single strand anneal (SSA) processes, laser anneal processes, flash anneal processes, furnace anneal processes, and/or other suitable processes. It is noted that the composition of the dielectric layer 510 is different from that of the nitridized oxide layer 410a. In some embodiments, the difference in nitrogen molar percentage between the dielectric layer 510 and the nitridized oxide layer 410a may be ranged from about 1 mol % to about 12 mol %, specifically about 2 mol % to about 10 mol %, more specifically 2 mol % to about 8 mol %. For example, the dielectric layer 510 is substantially free of nitrogen, while the nitridized oxide layer 410a has a nitrogen molar percentage of about 2 mol % to about 8 mol %.

The nitridized capping layer 310a and the nitridized oxide layer 410a may protect the fins 220, 230 from oxidation during the annealing processes according to some embodiments. As discussed above, annealing processes may be carried out in order to improve the quality of the dielectric layer 510, in accordance with some embodiments. In the annealing processes, the semiconductor substrate is subjected into a surrounding at a temperature of several hundred degrees Celsius or even higher in certain cases. At such high temperature, the fins 220, 230 are possibly oxidized due to the diffusion of oxygen from the dielectric layer 510 to the fins 220, 230. The oxidation of the fins 220, 230 unfavorably degrades the characteristics thereof. The nitridized capping layer 310a and the nitridized oxide layer 410a may block oxygen from diffusion into the fins 220, 230, and therefore protect the fins 220, 230 from oxidation during the annealing processes.

Figure 6:
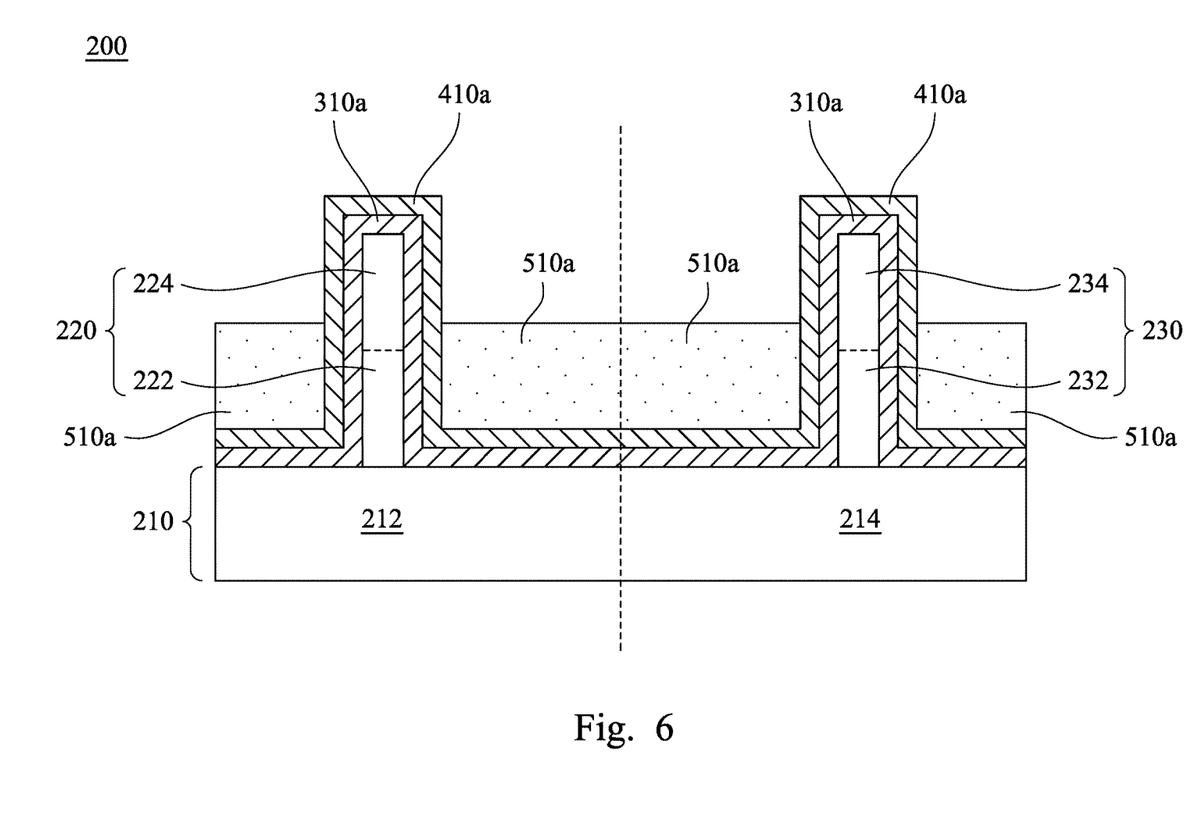
Figure 7:
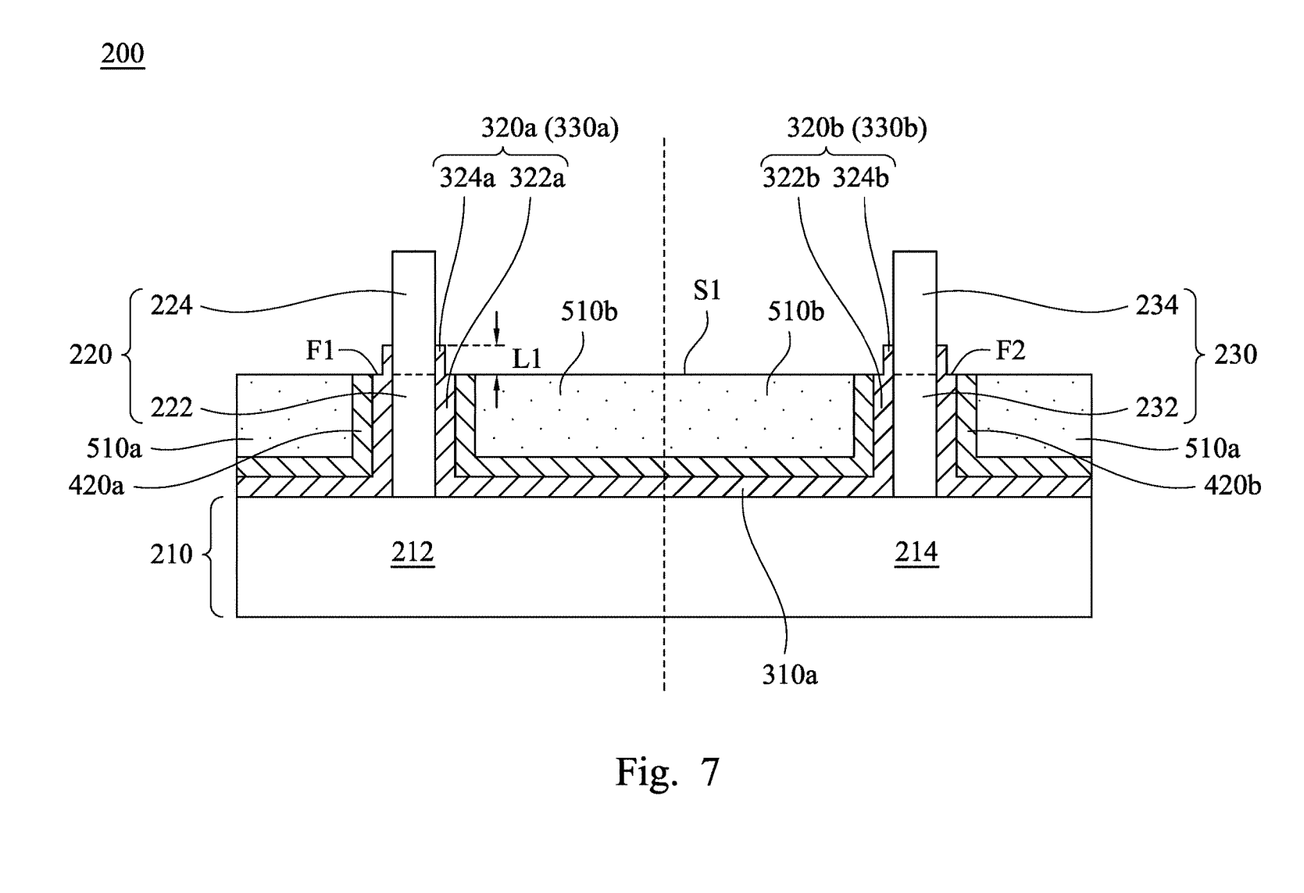

Referring now to FIG. 1, the method 100 proceeds to operation 150 by removing a portion of the dielectric layer, a portion of the nitridized oxide layer, and a portion of the nitridized capping layer to expose a portion of the fin. In some embodiments, the operation 150 may include multiple etching processes to gain a desired etch selectivity, flexibility and etch profile. FIGS. 6 and 7 illustrate detail steps of the operation 150 according to some embodiments of the present disclosure, in which multiple etching processes are used.

As illustrated in FIG. 6, a portion of the dielectric layer 510 is removed such that a portion of the nitridized oxide layer 410a is exposed. The removal of the dielectric layer 510 may include a dry etch, a wet etch, or a combination thereof. In examples, the dry etching process may use etchant such as for example fluorine-containing gas (e.g. $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof.

The nitridized capping layer 310a and the nitridized oxide layer 410a may mitigate or even resolve the "dishing" issue, in accordance some embodiments. During the annealing processes discussed above, nitrogen probably diffuses from the nitridized oxide layer 410a to the dielectric layer 510. The diffusion of nitrogen to the dielectric layer 510 may undesirably change the etching rate of the dielectric layer, and that causes the "dishing" issue. In accordance with some embodiments of the present disclosure, the nitrogen concentration of the nitridized oxide layer 410a is controlled within a certain range, and the diffusion of nitrogen from the nitridized oxide layer 410a to the dielectric layer 510 may be restrained during the annealing processes. Therefore, during the etching of the dielectric layer 510, the remained dielectric layer 510a may have a desired surface (e.g., substantially flat surface), and the "dishing" issue may be mitigated or even resolved.

As illustrated in FIG. 7, the exposed portion of the nitridized oxide layer 410a and the portion of the nitridized capping layer 310a thereunder is etched to expose portions of the fins 220, 230. For instance, the upper portions 222, 232 of the fins 220, 230 are exposed. In some embodiments, an identical etching process may be employed to etch both the nitridized oxide layer 410a and the nitridized capping layer 310a. The remained portions 320a, 320b of the nitridized capping layer 310a constitute bottom capping structures 330a, 330b. The bottom capping structures 330a, 330b respectively wrap the lower portions 222, 232 of the fins 220, 230. Further, the bottom capping structures 330a, 330b are interposed between the remained portion 420a of the nitridized oxide layer 410a and the corresponding one of the fins 220, 230. In yet some embodiments, since the characteristics of the materials of the nitridized oxide layer 410a and the nitridized capping layer 310a differ, the bottom capping structures 330a, 330b (e.g., remained portions 320a, 320b) include respective bases 322a, 322b and respective fringes 324a, 324b, each of the fringes 324a, 324b extends upwards from the top surface of the corresponding one of the bases 322a, 322b.

In accordance with some embodiments, during the etching of the nitridized oxide layer 410a and the nitridized capping layer 310a, the remained dielectric layer 510a are partially etched to be an isolation feature 510b between the fins 220, 230. In specifics, the thickness of the remained dielectric layer 510a depicted in FIG. 6 is reduced to form the isolation feature 510b in FIG. 7. In some embodiments, the top surfaces S1 of the isolation feature 510b is substantially leveled with the top surfaces F1, F2 of the bases 322a, 322b of the bottom capping structures 330a, 330b. The fringes 324a, 324b of the bottom capping structures 330a, 330b protrude out the top surface S1 of the isolation feature 510b.

In some embodiments, the remained portions 320a and 320b (e.g., the bottom capping structures 330a, 330b) of the nitridized capping layer 310a include nitrogen, and the remained portions 320a and 320b of the nitridized capping layer 310a have a nitrogen molar percentage of less than 12 mol %. For example, the nitrogen molar percentage of the remained portion 320a and 320b of the nitridized capping layer 310a is ranged from about 2 mol % to about 8 mol %, such as 3 mol %, 4 mol %, 5 mol %, 6 mol %, and 7 mol %.

Figure 8:
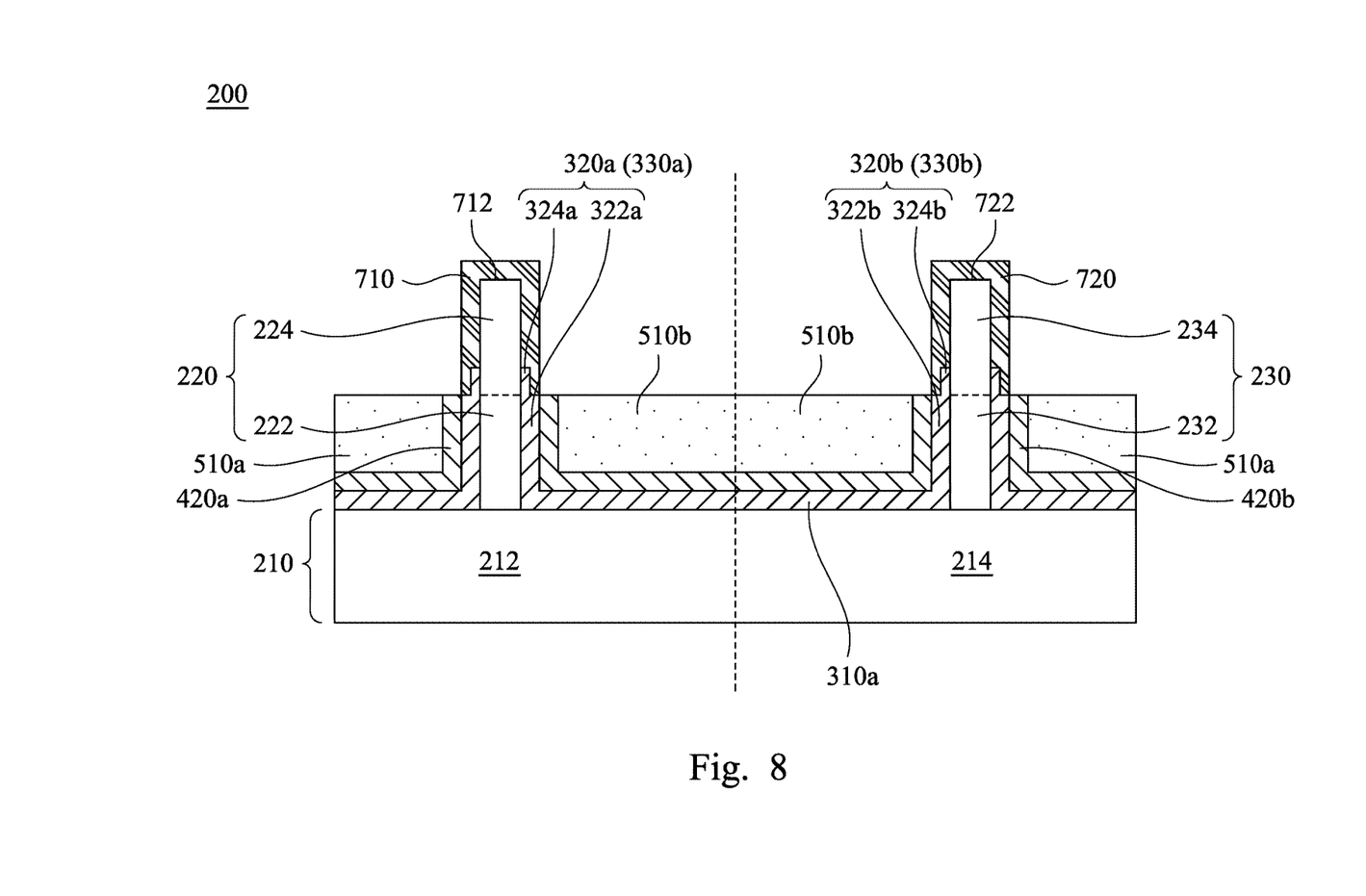

Referring now to FIGS. 1 and 8, the method 100 proceeds to operation 160 by forming a top capping structure over the bottom capping structure and covering a sidewall of the exposed portion of the fin. FIG. 8 illustrates the formation of top capping structures 710, 720 respectively on the bottom capping structure 330a, 330b. The top capping structures 710, 720 respectively cover the exposed portions (e.g., top portions 224, 234) of the fins 220, 230 according to some embodiments of the present disclosure. The top capping structures 710, 720 respectively cover the fringes 324a, 324b of the bottom capping structures 330a, 330b. In some embodiments, the top capping structures 710, 720 consists essentially of silicon and are substantially free of nitrogen. In some embodiments, the top capping structures 710, 720 may be formed by epitaxial growth processes, such as molecular beam epitaxial (MBE) processes, metalorganic chemical vapor deposition (MOCVD) processes, and/or other suitable epitaxial growth processes. Specifically, an identical component is included in the top portions 224, 234 of the fins 220, 230, the top capping structures 710, 720, and the bottom capping structures 330a, 330b. Therefore, the top capping structures 710, 720 may grow epitaxially from the top portions 224, 234 of the fins 220, 230 and the fringes 324a, 324b of the bottom capping structures 330a, 330b. The top capping structures 710, 720 may engage with the fringes 324a, 324b of the bottom capping structures 330a, 330b. In some embodiments, the top capping structures 710, 720 are merely formed covering the exposed portions of the fin 220, 230 and the fringes 324a, 324b, whereas the surface of the isolation feature 510b is free of the epitaxial material of the top capping structures 710, 720. Besides epitaxial growth processes, the top capping structures 710, 720 may be formed by a deposition process and followed by a selectively etching process. Illustrative examples of the deposition processes include chemical vapor deposition (CVD) processes, sub-atmospheric CVD (SACVD) processes, flowable CVD processes, atomic layer deposition (ALD) processes, physical vapor deposition (PVD) processes, and/or other suitable process. In some embodiments, a boundary 712 may be presented between the top capping structure 710 and the upper portion 224 of the fin 220, and a boundary 722 may be presented between the upper portion 234 of the fin 230 and the top capping structure 720. According to one aspect, the top capping structures 710, 720 may prevent the component of the fin 220 from diffusion into a gate dielectric layer formed in subsequent processes.

Figure 9:
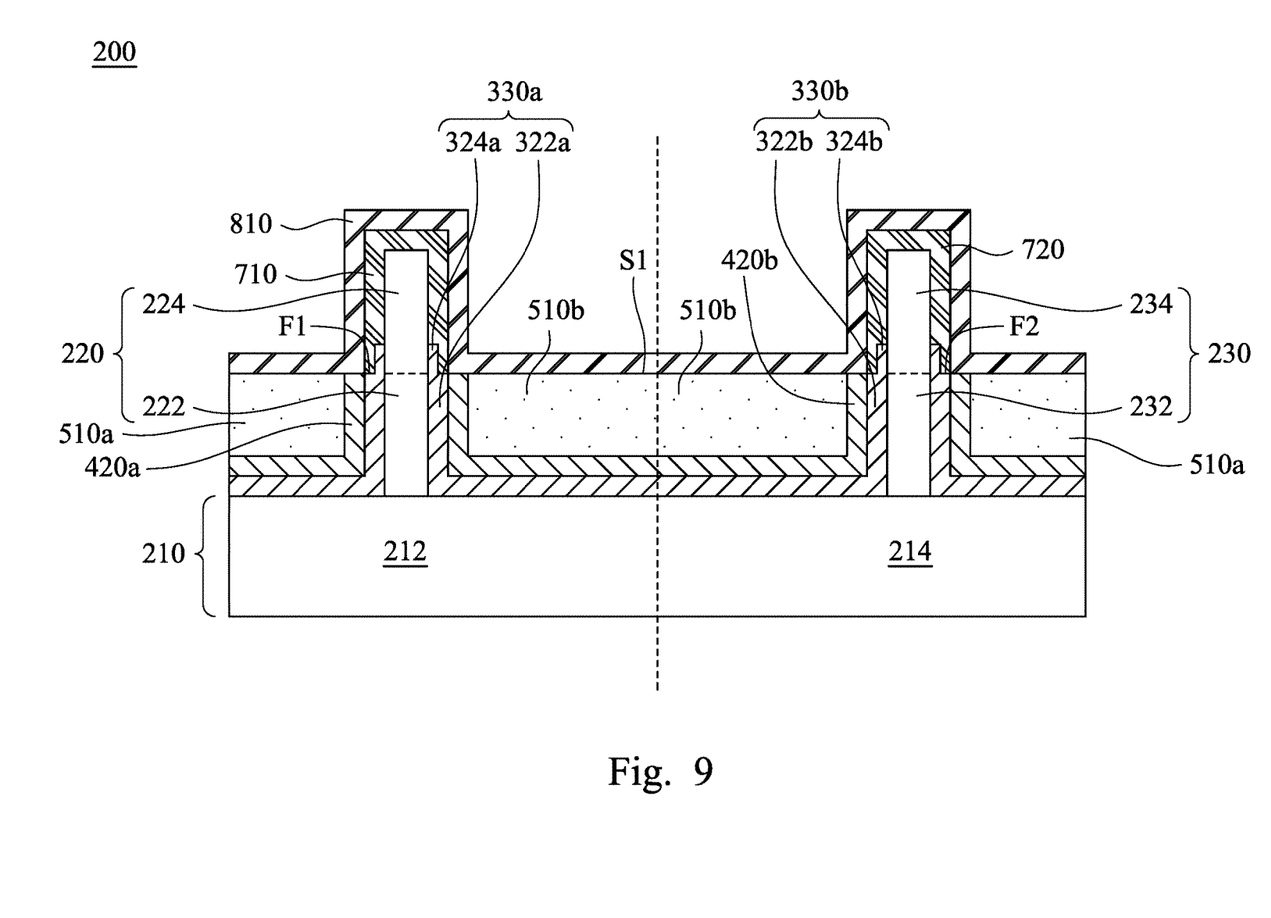

After the operation 160 shown in FIG. 1, the method 100 may further include other operations or steps. In some embodiments, a second oxide layer 810 may be formed to cover the top capping structures 710, 720, as illustrated in FIG. 9. The second oxide layer 810 may cover the top capping structures 710, 720 as well as the surface S1 of the isolation feature 510b. In some embodiments, the second oxide layer 810 may serve as a dummy gate dielectric layer. The second oxide layer 810 may be deposited or thermally grown according to acceptable techniques, in accordance with some embodiments. Additional processes may continue for the fabrication of one or more features on the structure illustrated in FIG. 9.

In accordance with another aspect of the present disclosure, a semiconductor structure is provided. FIG. 9 also illustrates a semiconductor structure 200 according to various embodiments of the present disclosure. The semiconductor structure 200 includes a substrate 210, fins 220, 230, bottom capping structures 330a and 330b, top capping structures 710, 720, bottom oxide wrapping layers 420a and 420b, and a top oxide wrapping layer 810.

The substrate 210 may be a semiconductor substrate, such as a semiconductor-on-insulator (SOI) substrate, a bulk semiconductor, or the like. Alternatively, the substrate may be a wafer, such as a silicon wafer. The SOI substrate may include a layer of a semiconductor material formed on an insulator layer. The insulator layer may be, for example, a silicon oxide layer, a buried oxide (BOX) layer, or the like. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, AlInAs, GaAsP, AlGaAs, GaInP, GaInAs and/or GaInAsP; or combinations thereof. In some embodiments, the substrate 210 has a PMOS region 212 and a NMOS region 214 thereon.

The fin 220 and the fin 230 are disposed on the substrate 210. The fin 220 has a lower portion 222 and an upper portion 224 extending upwards from the lower portion 222. The fin 230 has a lower portion 232 and an upper portion 234 extending upwards from the lower portion 232. In some embodiments, both the fins 220, 230 are made of silicon. In yet some embodiments, the lower portions 222, 232 of the fins 220, 230 include silicon or consist essentially of silicon with or without dopants, but the upper portions 224, 234 of the fins 220, 230 include silicon germanium or consist essentially of silicon germanium with or without dopants. In yet some embodiments, however, the material of the fin 220 formed on the PMOS region 212 may differ from that of the fin 230 formed on the NMOS region 214. Specifically, both the lower and upper portions 232, 234 of the fin 230 may include silicon or consist essentially of silicon with or without dopants, whereas the upper portion 224 of the fin 220 may include or consist essentially of silicon germanium while the lower portion 222 thereof may include or consist essentially of silicon with or without dopants. In some examples, the upper portion 224 of the fin 220 has a germanium molar concentration ranged from about 10% to about 35%, such as for example 15%, 20%, 25%, and 30%.

The bottom capping structure 330a covers the sidewall of the lower portion 222 of the fin 220. Similarly, the bottom capping structure 330b covers the sidewall of the lower portion 232 of the fin 230. In some embodiments, the bottom capping structures 330a, 330b include nitrogen. In some embodiments, each of the bottom capping structures 330a, 330b includes a silicon layer and nitrogen doped therein, and the nitrogen molar percentage of the bottom capping structures 330a, 330b is less than 12 mol %. For example, the nitrogen molar percentage may be ranged from about 2 mol % to about 8 mol %, such as 3 mol %, 4 mol %, 5 mol %, 6 mol %, and 7 mol %.

In some embodiments, the bottom capping structure 330a includes a base 322a and a fringe 324a. Similarly, the bottom capping structure 330b includes a base 322b and a fringe 324b. The fringes 324a, 324b respectively extend upwards from the bases 322a, 322b. Each of the fringes 324a, 324b has a width less than a width of each of the bases 322a, 322b. For example, the width of each of the fringes 324a, 324b is about 20% to 80% of the width of each of the bases 322a, 322b, such as 30%, 50% or 70%. In some embodiments, each of the fringes 324a, 324b has a height ranged from about 1 nm to about 10 nm, such as for example 2 nm, 4 nm, 6 nm, and 8 nm. In yet some embodiments, the base 322a and the fringe 324a are in contact with the sidewall of the lower portion 222 of the fin 220, and similarly the base 322b and the fringe 324b are in contact with the sidewall of the lower portion 232 of the fin 230. In yet some embodiments, top surfaces F1, F2 of the bases 322a, 322b are substantially leveled with the top surface S1 of the isolation structure 510b.

The top capping structure 710 and the top capping structure 720 are respectively disposed over the first and second bottom capping structures 330a, 330b, in accordance with some embodiments. Further, both the top capping structures 710, 720 are disposed over the isolation feature 510b. The top capping structures 710, 720 respectively cover the upper portions 224, 234 of the fins 220, 230. In some embodiments, the top capping structures 710, 720 consist essentially of silicon and are substantially free of nitrogen. In yet some embodiments, a boundary 712 may be presented between the upper portion 224 of the fin 220 and the top capping structure 710, and a boundary 722 is presented between the upper portion 234 of the fin 230 and the top capping structure 720.

In accordance with some embodiments, the bottom oxide wrapping layers 420a, 420b respectively cover the sidewalls of the bottom capping structures 330a, 330b. In some embodiments, each of the bottom oxide wrapping layers 420a, 420b has a nitrogen molar percentage ranged from 1 mol % to 12 mol %. For example, the nitrogen molar percentage of the nitridized oxide layer 420a, 420b may be about 2 mol % to about 8 mol %, such as 3 mol %, 4 mol %, 5 mol %, 6 mol %, and 7 mol %.

In accordance with some embodiments, the top oxide wrapping layer 810 covers the top capping structure 710, 720. The bottom oxide wrapping layer 420a, 420b include nitrogen while the top oxide wrapping layer 810 is free of nitrogen.

According to some embodiments, the semiconductor structure and the manufacturing method thereof provided herein are advantageous in the improvement of the "dishing" issue of the isolation feature (e.g., STI), thereby improving the device performance. Further, the semiconductor structure disclosed herein may protect the fin structure from oxidation when annealing processes are performed, in accordance with some embodiments. In addition, the semiconductor structure disclosed herein prevents the material of the fin from diffusion to a surrounding dielectric.

In accordance with one aspect of some embodiments, a semiconductor structure includes a substrate, a fin, a bottom capping structure and a top capping structure. The fin is disposed on the substrate, and the fin has a lower portion and an upper portion extending upwards from the lower portion. The bottom capping structure covers a sidewall of the lower portion of the fin. The top capping structure covers a sidewall of the upper portion of the fin.

In accordance with another aspect of some embodiments, a semiconductor structure includes a substrate, a first fin and a second fin, a first bottom capping structure, a second bottom capping structure, a first top capping structure and a second top capping structure. The substrate has a PMOS region and a NMOS region thereon. The first fin and a second fin are respectively disposed on the PMOS region and the NMOS region, wherein each of the first fin and the second fin includes an upper portion and a lower portion. The first bottom capping structure and a second bottom capping structure respectively cover a sidewall of the lower portion of the first fin and a sidewall of the lower portion the second fin. The first top capping structure and a second top capping structure are respectively disposed over the first and second bottom capping structures, the first and second top capping structures respectively cover a sidewall of the upper portion of the first fin and a sidewall of the upper portion of the second fin, wherein the bottom capping structure includes nitrogen, and the top capping structure is free of nitrogen.

In accordance with another aspect of some embodiments, a method includes the following operations: forming a fin on a substrate; forming a nitridized capping layer covering the fin; forming a nitridized oxide layer covering nitridized capping layer; forming a dielectric layer over the nitridized oxide layer; removing a portion of the dielectric layer, a portion of the nitridized oxide layer, and a portion of the nitridized capping layer to expose a portion of the fin, wherein a remained portion of the nitridized capping layer constitutes a bottom capping structure between the fin and a remained portion of the nitridized oxide layer; and forming a top capping structure over the bottom capping structure and covering a sidewall of the exposed portion of the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a fin on a substrate;
    forming a nitridized capping layer covering the fin;
    forming a nitridized oxide layer covering nitridized capping layer;
    forming a dielectric layer over the nitridized oxide layer;
    removing a portion of the dielectric layer, a portion of the nitridized oxide layer, and a portion of the nitridized capping layer to expose a portion of the fin, wherein a remained portion of the nitridized capping layer constitutes a bottom capping structure between the fin and a remained portion of the nitridized oxide layer; and
    forming a top capping structure over the bottom capping structure and covering a sidewall of the exposed portion of the fin.

2. The method of claim 1, wherein the bottom capping structure comprises a base and a fringe extending upwards from the base, and the fringe has a width less than a width of the base.

3. The method of claim 1, wherein the bottom capping structure comprises nitrogen and the top capping structure is free of nitrogen.

4. The method of claim 1, wherein removing the portion of the dielectric layer, the portion of the nitridized oxide layer, and the portion of the nitridized capping layer comprises:
    etching away the portion of the dielectric layer to expose the portion of the nitridized oxide layer; and removing the exposed portion of the nitridized oxide layer and the portion of the nitridized capping layer so to expose the portion of the fin.

5. The method of claim 1, wherein forming the nitridized capping layer comprises:
depositing a capping material layer conformally covering the fin; and
nitridizing the capping material layer to form the nitridized capping layer.

6. A method for manufacturing a semiconductor structure, comprising:
providing a substrate having PMOS and NMOS regions;
forming first and second fins respectively in the PMOS and NMOS regions;
depositing a capping material layer conformally covering the first and second fins;
nitridizing the capping material layer to forma nitridized capping layer covering the first and second fins;
removing the nitridized capping layer to expose upper portions of the first and second fins;
forming a top capping structure that covers the upper portions of the first and second fins; and
forming an oxide layer covering the top capping structure.

7. The method of claim 6, wherein nitridizing the capping material layer comprises doping the capping material layer with nitrogen.

8. The method of claim 6, further comprising:
forming a nitridized oxide layer that covers the nitridized capping layer and the upper portions of the first and second fins; and
removing the nitridized oxide layer to expose the upper portions of the first and second fins.

9. The method of claim 6, wherein forming the top capping structure is such that the top capping structure is free of nitrogen.

10. The method of claim 6, wherein removing the nitridized capping layer is such that the nitridized capping layer comprises a base that surrounds lower portions of the first and second fins and a fringe that extends from the base and that has a width less than a width of the base.

11. The method of claim 10, wherein removing the nitridized capping layer is such that the width of the fringe is about 20% to 80% of the width of the base.

12. The method of claim 8, wherein removing the nitridized capping layer comprises etching a dielectric layer to expose the nitridized oxide layer.

13. A method for manufacturing a semiconductor structure, comprising:
forming a fin on a substrate;
forming a nitridized capping layer such that the nitridized capping layer includes a base that surrounds a lower portion of the fin and a fringe that extends from the base and that has a width less than a width of the base; and
forming a top capping structure covering a upper portion of the fin and the fringe of the nitridized capping layer.

14. The method of claim 13, wherein forming the top capping structure is such that the top capping structure comprises a base that covers an upper portion of the fin and a fringe that extends from the base of the top capping structure and that covers the fringe of the nitridized capping layer and such that the sum of a width of the fringe of the nitridized capping layer and a width of the fringe of the top capping structure is equal to a width of the base of the top capping structure.

15. The method of claim 13, wherein forming the top capping structure is such that the top capping structure is free of nitrogen.

16. The method of claim 13, wherein forming the nitridized capping layer comprises doping a silicon layer with nitrogen.

17. The method of claim 13, further comprising:
forming a nitridized oxide layer that covers the nitridized capping layer; and
removing the nitridized oxide layer and the nitridized capping layer to expose an upper portion of the fin.

18. The method of claim 13, wherein forming the nitridized capping layer comprises:
depositing a capping material layer conformally; and
nitridizing the capping material layer.

19. The method of claim 13, further comprising forming an oxide layer covering the top capping structure.

20. The method of claim 6, wherein nitridizing the capping material layer comprises performing a rapid thermal nitridation process.

* * * * *